United States Patent
Palanisamy (10) Patent No.: US 6,939,737 B2
(45) Date of Patent: Sep. 6, 2005

(54) LOW-COST CIRCUIT BOARD MATERIALS AND PROCESSES FOR AREA ARRAY ELECTRICAL INTERCONNECTIONS OVER A LARGE AREA BETWEEN A DEVICE AND THE CIRCUIT BOARD

(75) Inventor: Ponnusamy Palanisamy, Lansdale, PA (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/991,707

(22) Filed: Nov. 18, 2004

(65) Prior Publication Data

US 2005/0095878 A1 May 5, 2005

Related U.S. Application Data (62) Division of application No. 10/435,960, filed on May 12, 2003, now Pat. No. 6,849,935.
(60) Provisional application No. 60/379,456, filed on May 10, 2002.

(51) Int. Cl.$^7$ .............................................. H01L 21/44
(52) U.S. Cl. ...................... 438/106; 438/107; 438/110; 438/112; 438/121; 438/122; 438/113; 438/611; 438/612; 438/613; 174/254; 174/260; 174/361; 174/749
(58) Field of Search ................................ 438/106, 107, 438/110, 112, 121, 122, 113, 611; 174/612, 613, 254, 260, 361, 749

(56) References Cited

U.S. PATENT DOCUMENTS 5,634,265 A * 6/1997 Difrancesco ................. 29/825

| | | |
|---|---|---|
| 5,729,896 A | 3/1998 | Dalal et al. |
| 5,880,705 A | 3/1999 | Onyskevych et al. |
| 5,929,562 A | 7/1999 | Pichler |
| 6,252,564 B1 | 6/2001 | Albert et al. |
| 6,271,598 B1 | 8/2001 | Vindasius et al. |
| 6,274,978 B1 | 8/2001 | Roach et al. |
| 6,370,019 B1 | 4/2002 | Matthies et al. |
| 6,373,142 B1 | 4/2002 | Hoang |
| 6,410,415 B1 | 6/2002 | Estes et al. |
| 6,498,592 B1 | 12/2002 | Matthies |
| 6,541,919 B1 | 4/2003 | Roach et al. |
| 6,785,144 B1 * | 8/2004 | Akram ...................... 361/749 |
| 2002/0008463 A1 | 1/2002 | Roach |
| 2003/0011300 A1 | 1/2003 | Palanisamy et al. |
| 2003/0011302 A1 | 1/2003 | Palanisamy |

FOREIGN PATENT DOCUMENTS

WO    WO 99/41732    8/1999

* cited by examiner

Primary Examiner—B. William Baumeister
Assistant Examiner—Victor V. Yevsikov
(74) Attorney, Agent, or Firm—William J. Burke (57) ABSTRACT

An electronic device and coupled flexible circuit board and method of manufacturing. The electronic device is coupled to the flexible circuit board by a plurality of Z-interconnections. The electronic device includes a substrate with electronic components coupled to it. The substrate also has a plurality of device electrical contacts coupled to its back surface that are electrically coupled to the electronic components. The flexible circuit board includes a flexible substrate having a front surface and a back surface and a plurality of circuit board electrical contacts coupled to the front surface of the flexible substrate. The plurality of circuit board electrical contacts correspond to plurality of device electrical contacts. Each Z-interconnection is electrically and mechanically coupled to one device electrical contact and a corresponding circuit board electrical contact.

19 Claims, 8 Drawing Sheets

LOW-COST CIRCUIT BOARD MATERIALS AND PROCESSES FOR AREA ARRAY ELECTRICAL INTERCONNECTIONS OVER A LARGE AREA BETWEEN A DEVICE AND THE CIRCUIT BOARD

CROSS-REFERENCE TO RELATED APPLICATIONS

This application is a divisional of U.S. application Ser. No. 10/435,960, filed May 12, 2003 now U.S. Pat. No. 6,849,935 which claims the benefit of priority of U.S. Provisional Application No. 60/379,456, filed May 10, 2002, the contents of which are incorporated herein by reference.

FIELD OF THE INVENTION

This invention is in the field of electronic device circuit boards and interconnections, and specifically relates to the use of Z-interconnections with flexible circuit boards.

BACKGROUND OF THE INVENTION

The use of short interconnections normal to the surfaces of circuit boards (Z-interconnections) is one method to desirably create space saving multi-layer circuit board configurations. For example, in sufficiently complex devices, the number and complexity of the desired interconnections may make the use of a multiple layer circuit board design desirable. Matrix array devices, such as are often found in pixel-based detector and display applications, may also desirably include multiple circuit board configurations coupled using Z-interconnections.

Area array electrical Z-interconnections over relatively large areas (squares of 4 to 6 inches per side) may be particularly desirable to build display modules that could be utilized in the construction of large-area seamless displays, or relatively large area, high-resolution detector arrays. For seamless integration, it is desirable for all electrical connections from the display panel (device in this application) to the circuit board to be made within the space between the device and the circuit board, because the device is covered with display elements almost all the way to the edges. There may be insufficient inactive area at the edges of the device for electrical connections.

Therefore, low cost circuit board materials and processes for forming substantially identical Z-interconnections throughout the large area module are desirable. Achieving high yields and long-term reliability of those interconnections are also desirable.

For example, in the current fabrication of displays based on organic light emitting diode (OLED) as the active element, it is sometimes considered necessary to hermetically seal the circuit board to the device. This is because the primary passivation on the device provided by some device manufacturers are not adequate. Therefore, display module manufacturers use more expensive rigid inorganic circuit board materials such as multi-layer alumina ceramic board that can provide a hermetic cover to the device. A sequential screen printing of conducting (noble metal) layers and insulating layers on a pre-fired, laser-drilled alumina ceramic is used to achieve the circuit precision needed for large area circuits. Due to the relatively lower circuit density of these boards, several layers of metallization may be needed to accomplish the needed circuit routing. These factors result in high materials and production cost in making these circuit boards for back panel applications.

SUMMARY OF THE INVENTION

One embodiment of the present invention is an electronic device and coupled flexible circuit board. The electronic device is coupled to the flexible circuit board by a plurality of Z-interconnections. The electronic device includes a substrate with electronic components coupled to it. The substrate also has a plurality of device electrical contacts coupled to its back surface that are electrically coupled to the electronic components. The flexible circuit board includes a flexible substrate having a front surface and a back surface and a plurality of circuit board electrical contacts coupled to the front surface of the flexible substrate. The plurality of circuit board electrical contacts correspond to plurality of device electrical contacts. Each Z-interconnection is electrically and mechanically coupled to one device electrical contact and a corresponding circuit board electrical contact.

Another embodiment of the present invention is a method of manufacturing the exemplary an electronic device and coupled flexible circuit board. The exemplary method includes providing the electronic device and the flexible circuit board. A plurality of conductive bumps are formed on at least one of the electronic device and the flexible circuit board. For each device electrical contact, a conductive bump is formed on that device electrical contact, the corresponding circuit board electrical contact, or both. The plurality of device electrical contacts of the electronic device and the corresponding plurality of circuit board electrical contacts are aligned and the electronic device and the flexible circuit board are bonded together such that the conductive bumps contact the corresponding conductive bumps or electrical contact. The conductive bumps are then cured to form Z-interconnections, electrically and mechanically coupling the device electrical contacts to the corresponding circuit board electrical contacts.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present invention involves low cost circuit board materials and processes for achieving high yields and long-term reliability of electrical interconnections between a large-area device and a circuit board.

High interest in OLED displays has led to considerable R & D activity in this area. Some of this effort has been directed towards hermetic integral passivations on the front panel. Such a passivation is desirable to allow the use of non-hermetic back panel materials. Among the possible non-hermetic back panel materials low cost organic-based circuit board materials offer a number of advantages, such as improved processes for forming substantially identical interconnections throughout the large area module and achieving high yields and long-term reliability of those interconnections. Flexible circuit boards based on polyimide (for example Kapton from DuPont), polyester (for example Mylar from DuPont), and various laminated structures of these families of materials may be particularly desirable. Laminate materials with built-in gas (moisture, oxygen) barrier layers, such as DuPont Mylar 250 SBL 300, may be used in applications where having this barrier is desirable for the back panel.

Figure 1A:
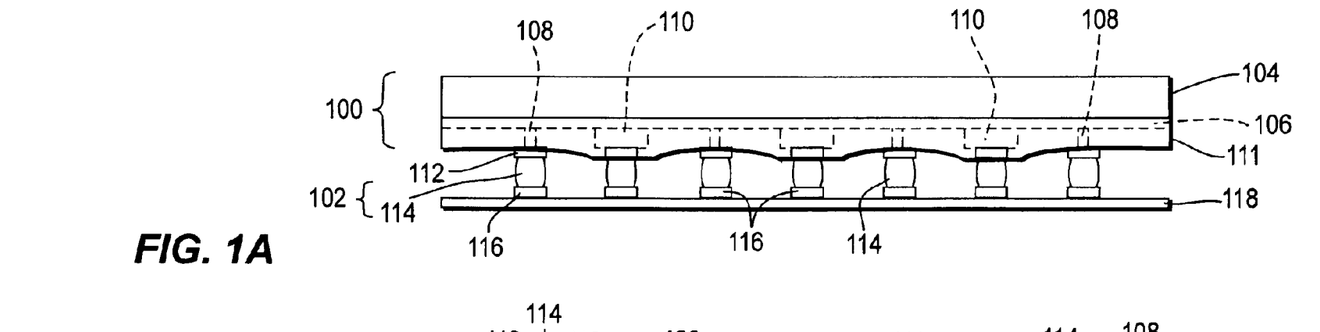
FIG. 1A is a side cut-away drawing of an exemplary electronic device and coupled flexible circuit board, cut along line 1A—1A of FIG. 1B.
Figure 1B:
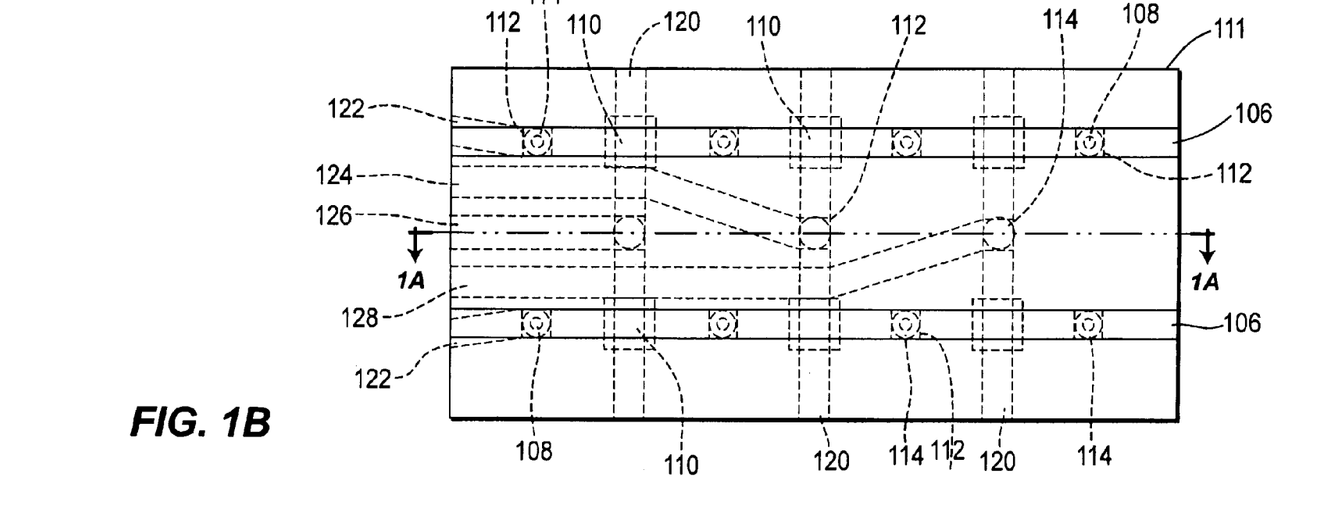
FIG. 1B is a top plan drawing of the exemplary electronic device and coupled flexible circuit board of FIG. 1A.

FIGS. 1A and 1B illustrate an exemplary electronic device 100 and flexible circuit board 102 according the present invention. Substrate 104 of electronic device 100 is not shown in FIG. 1B for illustration purposes. Although exemplary electronic device 100 shown in these Figures, as well as in FIGS. 5A–C, 6, 7, 8, 9, 10A, and 10B, is shown as an exemplary six pixel electro-optic array, this in merely illustrative of a possible electronic device and should not be construed as a limitation. Other electro-optic arrays or electronic devices, such as those shown in FIGS. 3A and 3B including a plurality of electronic components 302 mounted on drilled substrate 300, may be used as well.

The exemplary electro-optic device shown in FIGS. 1A, 1B, 5A–C, 6, 7, 8, 9, 10A, and 10B includes substrate 104, column electrode 106, active material 110, passivation layer 111, and row electrodes 120. Device electrical contacts 112 are arranged on the back surface of the device to allow electrical coupling of the row and column electrodes to the flexible circuit board. These device electrical contacts may be directly coupled to the row electrodes and may be electrically coupled to the column electrodes through passivation layer 111 by vias 108.

Desirably substrate 104 is formed of a substantially transparent material such as float glass, quartz, sapphire, acrylic, polyester, polyimide or a laminate of these materials. Column electrodes 106 desirably include a substantially transmissive, conductive material such as indium tin oxide, thin gold, polyaniline, or a combination. Row electrodes 120, device electrical contacts 112, and vias 108 are desirably formed of a conductive material such as aluminum, aluminum-calcium, gold, silver, copper, nickel, titanium, tungsten, platinum, germanium, polyaniline, polyamide, polysilicon, or a combination thereof. It may be desirable for row electrodes 120, device electrical contacts 112, and vias 108 to be formed of the same material. Active material 110 may be formed of semiconductor layers and/or organic polymer layers to form the light emitting or absorbing portion of electro-optic pixel components, such as liquid crystal displays, OLED's, light emitting diodes, and photodetectors.

Flexible circuit board 102 includes flexible substrate 118, circuit board contacts 116, and a number of electrical traces formed on the front surface of flexible substrate 118. These electrical traces include column electrical traces 122 and row electrical traces 124, 126, and 128. In one exemplary embodiment, the row electrical traces 124, 126, and 128 may be used to provide operational power for different colors of pixels. For example, row electrical traces 124 may be coupled to red pixels, row electrical traces 126 may be coupled to blue pixels, and row electrical traces 128 may be coupled to green pixels.

Flexible substrate 118 may desirably be formed of a flexible organic substrate material such as polyester, polyimide or a laminate of these materials. Electrical traces 122, 124, 126, and 128 and circuit board electrical contacts 116 are desirably formed of a conductive material such as aluminum, aluminum-calcium, gold, silver, copper, nickel, titanium, tungsten, platinum, germanium, polyaniline, polyamide, polysilicon, or a combination thereof. It may be desirable for electrical traces 122, 124, 126, and 128 and circuit board electrical contacts 116 to be formed of the same material.

In this exemplary embodiment, electronic device 100 and flexible circuit board 102 are electrically and mechanical coupled together by Z-interconnections 114. These Z-interconnections are desirably, formed of an electrically conductive material such as indium, a conductive solder, a conductive thermally-curable epoxy, a conductive radiation-curable epoxy, a conductive thermoplastic, and/or a conductive elastomer.

In addition to electrically and mechanically coupling electronic device 100 and flexible circuit board 102, Z-interconnections 114 desirably thermally couple electronic device 100 and flexible circuit board 102. Flexible substrate 118 may desirably be very thin <10 mils, therefore, even though the thermal conductivity of many flexible substrate materials may be low, thermal transfer from the front to back surfaces of the flexible substrate may be quite high, but lateral diffusion of heat may be poor. The relatively high thermal conductivity of the electrical traces may help with lateral diffusion of heat.

Figure 2:
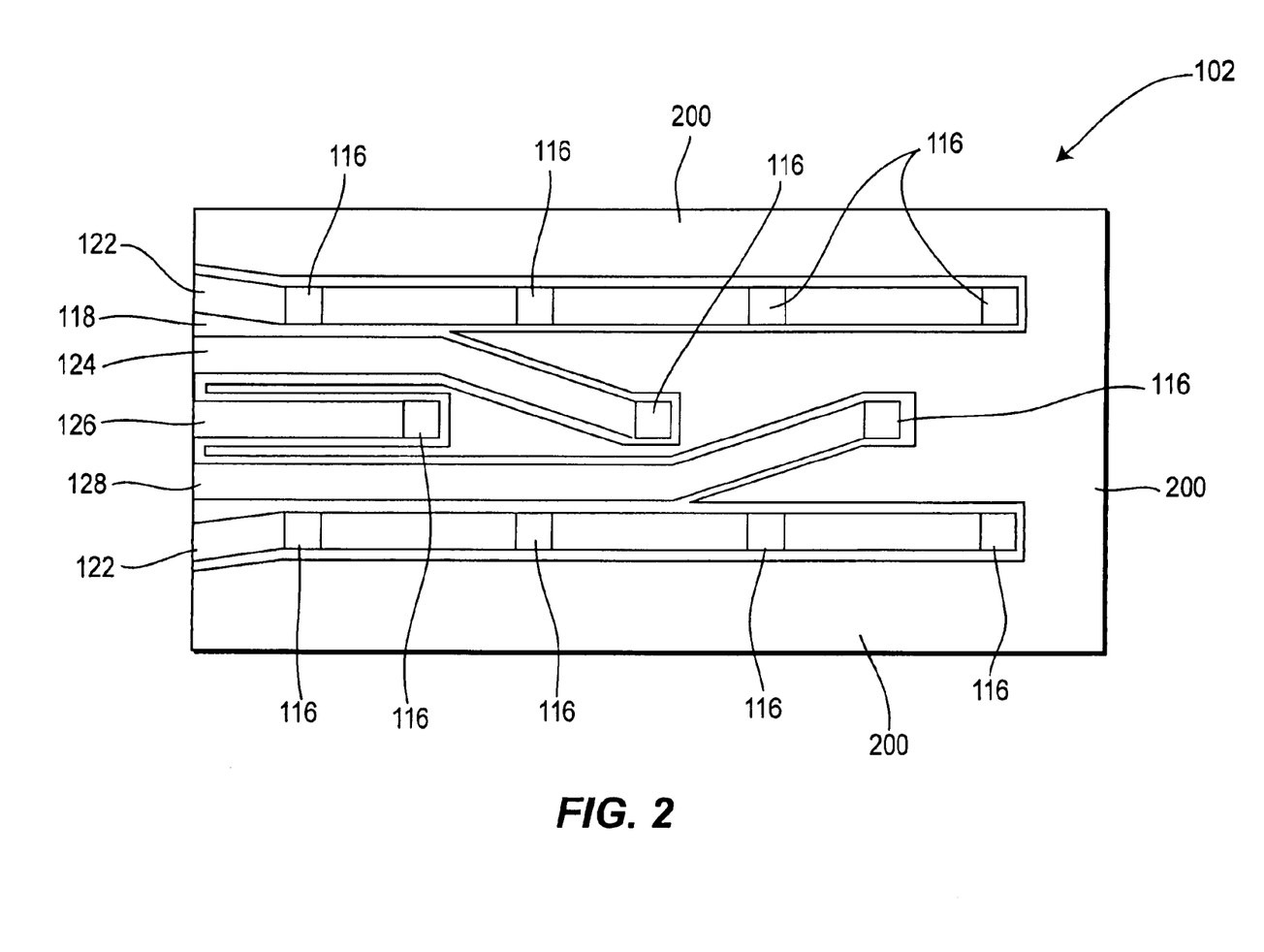
FIG. 2 is top plan drawing of an exemplary flexible circuit board layout for the flexible circuit board of FIGS. 1A and 1B.

FIG. 2 illustrates an alternative exemplary embodiment of flexible circuit board 102, which includes front side thermal conductivity layer 200 to assist the lateral heat diffusion of the flexible circuit board. This thermal conductivity layer may desirably be formed of the same material as electrical traces 122, 124, 126, and 128. It is also possible to form a back side thermal conductivity layer on the back surface of flexible substrate 118 to accomplish spreading of heat. This back side thermal conductivity layer may cover the entire back surface of the flexible substrate, or it may be patterned to allow additional electrical traces on this side of flexible circuit board 102 and or to channel heat to certain regions of the flexible circuit board.

Figure 3A:
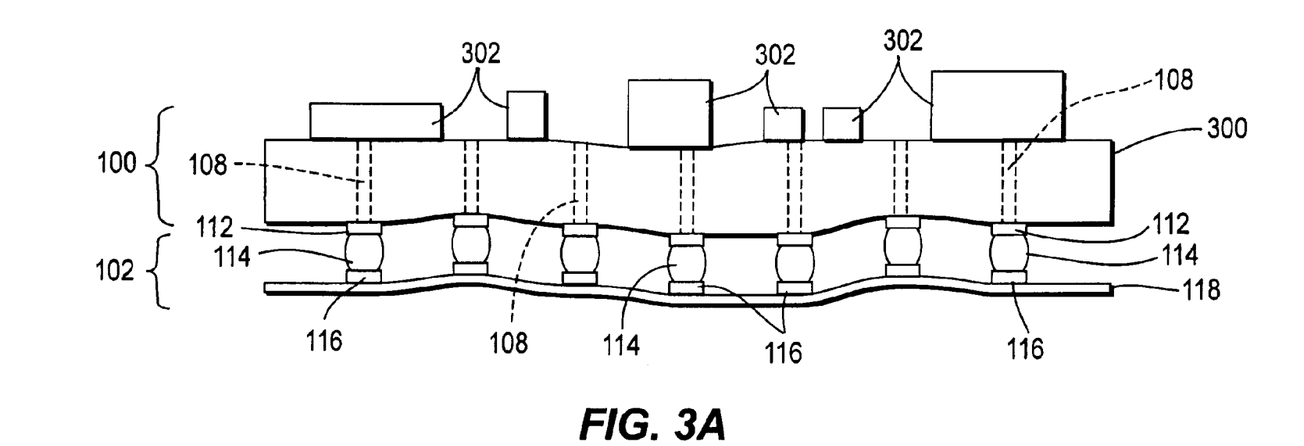
FIGS. 3A, 3B, and 3C are side cut-away drawings illustrating exemplary advantages of a flexible circuit board, cut along line 1A—1A of FIG. 1B.
Figure 3B:
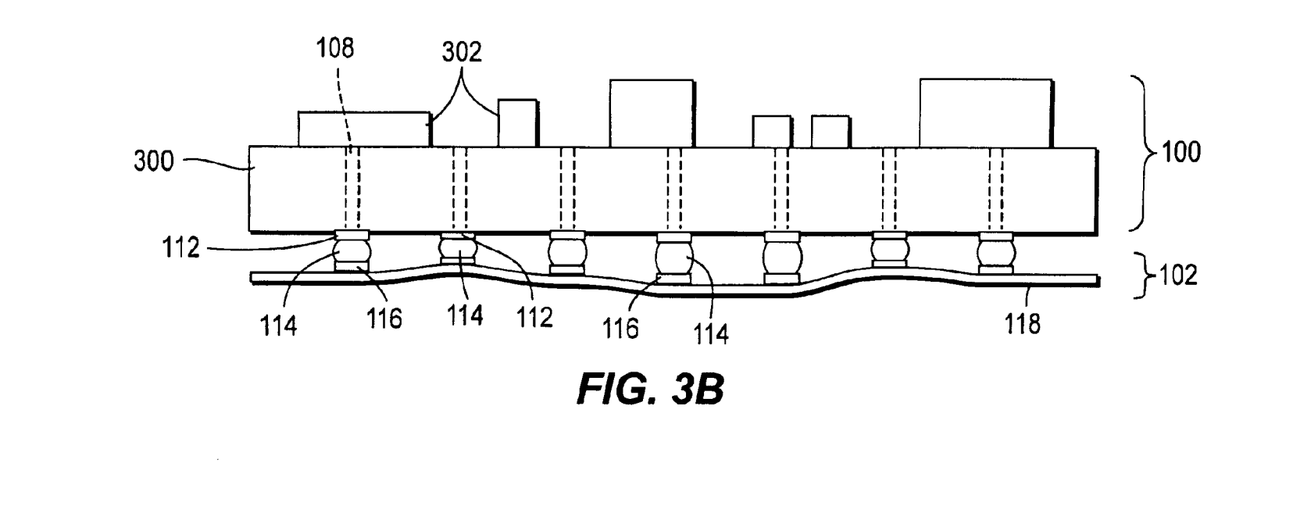
Figure 3C:
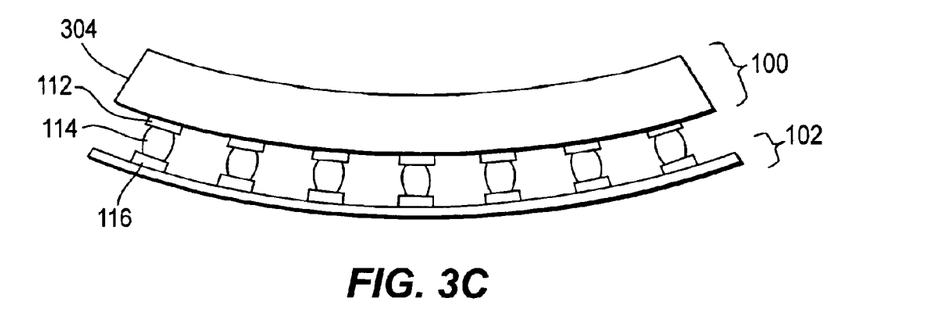

FIGS. 3A–C illustrates some of the advantages that may be derived from the present invention. In the exemplary embodiments of FIGS. 3A and 3B, electronic device 100 includes drilled substrate 300 with vias 108 extending from its front surface to its back surface. This substrate may be formed of any standard substrate material such as glass, alumina, epoxy resin, fiberglass, polyester, and polyimide. Electronic components 302 are mounted on the front surface of drilled substrate 300 and electrically coupled to electrical contacts 112 formed on the back surface of drilled substrate 300 though vias 108. These electronic components may include electrical traces, separate components such as resistors, capacitor, and transistors, or integrated circuitry.

FIG. 3A illustrates how exemplary flexible circuit board 102 may desirably allow for reliable Z-interconnections 114 even in the face of camber or unevenness in the back surface of the electronic device. This ability to overcome camber may allow for less restrictive tolerances in selection of substrates for electronic device 100, possibly lowering the cost of manufacturing and improving yield of these devices.

Also, this relative insensitivity to camber means that Z-interconnections 114 may desirably be smaller. With a rigid circuit board, the Z-interconnections should be large enough to compensate for the anticipated camber. In locations where the camber of both the rigid circuit board and the electronic device lead to large gaps, the Z-interconnection is desirably formed from a material with a sufficient thickness to cross the gap. When the Z-interconnections are made using deformable solder bumps, for example, it is desirable for the deformable bumps from which the Z-interconnections are formed to be at least as large as the largest expected gap, which constrains the minimum separation for the Z-interconnections. In locations where the combined cambers lead to a narrower gap, the deformable bumps may have too much material and expand laterally when deformed, further enlarging the minimum separation of the Z-interconnections. This issue may be further accentuated for large area arrays, as larger substrates tend to have larger cambers.

As FIG. 3A illustrates, this problem is greatly reduced by using exemplary flexible circuit board 102. This means that the overall thickness of the Z-interconnections may be reduced and that the density of the Z-interconnections may be greatly increased. Shorter Z-interconnections have less resistance and may lead to a thinner final device. Fine-pitch interconnections are practical with flex circuit back panels because flex circuits offer high density circuitry, and the interconnections can be made very small in cross-section. Minimum separations between the centers of Z-interconnections of <10 mils, or even <2 mils, may be achieved for large area arrays by using a flexible circuit board.

FIG. 3B illustrates the related problem of unevenly sized Z-interconnections. It may be difficult to precisely control the size of the deformable bumps from which Z-interconnections 114 are formed, but differently sized bumps lead to differently sized Z-interconnections. A rigid substrate may cause particularly large deformable bumps to expand too much laterally, possibly leading to shorts and may not form the Z-interconnections of particularly small deformable bumps. Additionally it is noted that it may be desirable to intentionally vary the size of the Z-interconnections. These issues may be addressed by using exemplary flexible circuit board 102 as shown in FIG. 3B.

FIG. 3C illustrate the use of exemplary flexible circuit board 102 when electronic device 100 includes non-planar substrate 304. It is noted that although non-planar substrate 304 is shown as substantially spherically concave, it could be convex, non-spherically curved, or bent at an angle as well. Such non-planar substrates may be particularly desirable for use in curved displays or detector, or the fit in particular spaces within a larger device. Alignment of the circuit board electrical connections to the device electrical connections to form the Z-interconnections may be significantly easier for a flexible circuit board, as the flexible circuit board may be aligned in stages to maintain the alignment across a large area.

Overall weight reduction of the completed device may also be possible because flex circuit is thinner and weights less than an equivalent ceramic, glass, or rigid organic circuit board.

Figure 4:
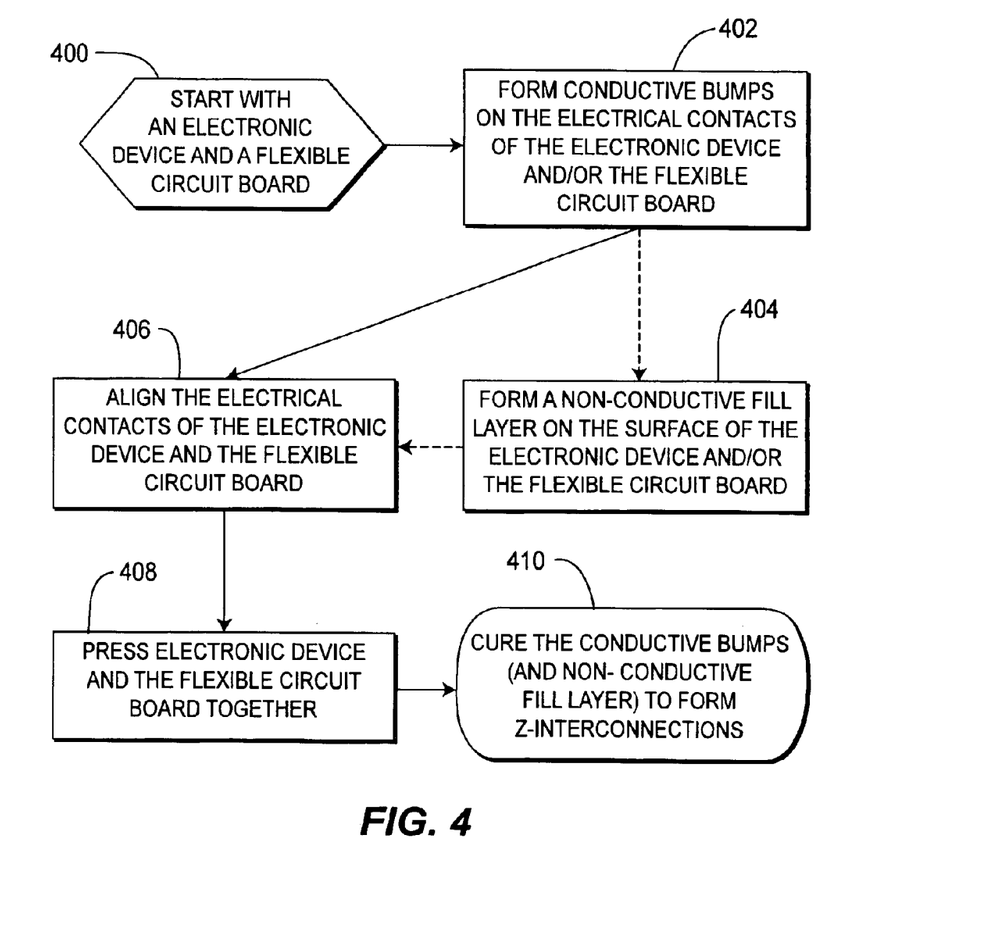
FIG. 4 is a flowchart illustrating an exemplary method of manufacture of the exemplary electronic device and coupled flexible circuit board of FIGS. 1A and 1B.
Figure 5A:
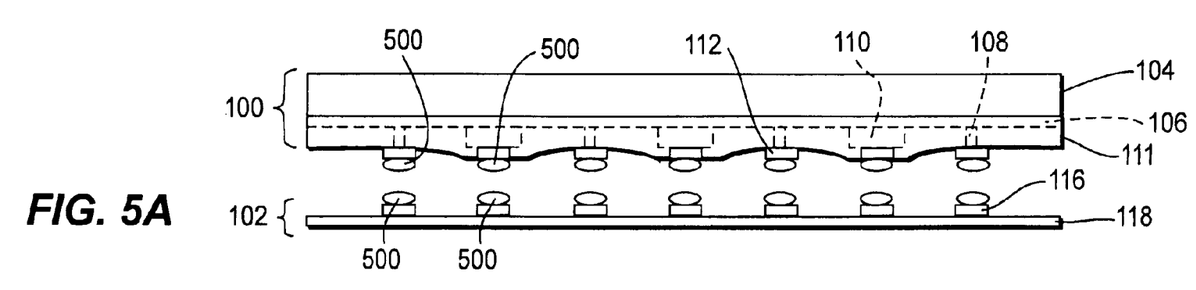
FIGS. 5A–C are side cut-away drawings of alternative exemplary electronic device and coupled flexible circuit boards during manufacture according to the flowchart of FIG. 4, cut along line 1A—1A of FIG. 1B.
Figure 5B:
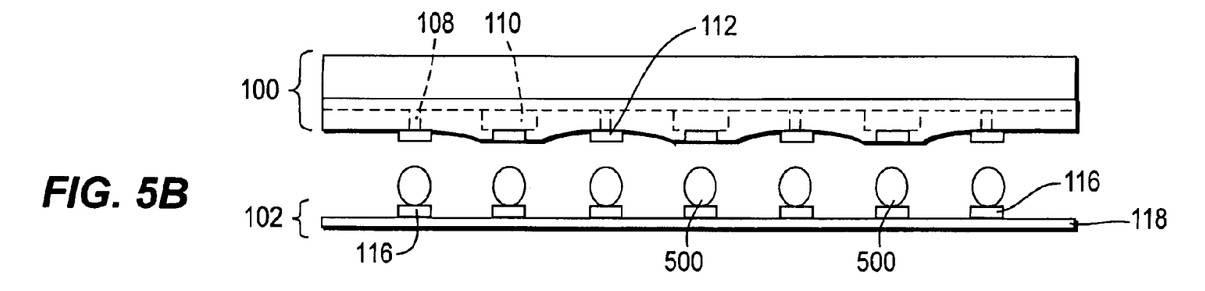
Figure 5C:
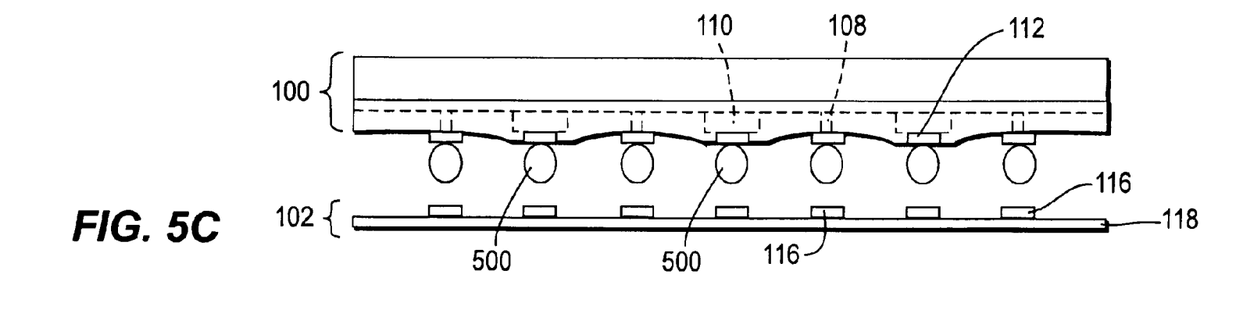

FIG. 4 illustrates an exemplary method of manufacturing an electronic device and coupled flexible substrate according to the present invention. The method begins with electronic device 100 and flexible circuit board 102, step 400. Conductive bumps, or balls, 500 are formed on at least one of the device electrical contact 112 or the circuit board electrical contact 116 associated with each Z-interconnection 114, step 402. These conductive bumps may be formed of indium, a conductive solder, a conductive thermally-curable epoxy, a conductive radiation-curable epoxy, a conductive thermoplastic, and/or a conductive elastomer. Conductive bumps 500 may be formed on each device electrical contact 112 and each circuit board electrical contact 116 as shown in FIG. 5A, each circuit board electrical contact 116 as shown in FIG. 5B, each device electrical contact 112 as shown in FIG. 5C, or some device electrical contacts 112 and some circuit board electrical contacts 116 (not shown) as long as at least one conductive bump is formed for each Z-interconnection to be formed. Conductive bumps 500 may be formed using standard deposition or screen printing techniques, including sputtering, vaporization, and ink jet methods. It may be desirable to apply flux to conductive bumps formed of conductive solder.

It may be desirable to form the solder bumps on one side of each Z-interconnection and an organic conductor, such as a conductive thermally-curable epoxy, a conductive radiation-curable epoxy, a conductive thermoplastic, or a conductive elastomer, on the other side. This method may provide better yield than organic conductor bumps alone. It may also be desirable to use the exemplary embodiment of FIG. 5A with conductive bumps 500 on all of the electrical contacts when forming indium or other cold welded Z-interconnections.

As an alternative embodiment, a non-conductive fill layer may also be formed on the back surface of electronic device 100, the front surface of flexible circuit board 102, or both, alternative step 404. The non-conductive fill layer is desirably formed on a portion of the facing surfaces on which there are no Z-interconnections. This non-conductive fill layer may desirably be formed of a non-conductive (electrically) organic material such as a non-conductive epoxy, a non-conductive thermoplastic, and a non-conductive elastomer. Electrically conductive organic materials such as conductive epoxies, conductive thermoplastics, and conductive elastomers, are often formed by suspending metal particles in an organic matrix. The non-conductive organic material of the non-conductive fill layer may include thermally (but not electrically) conductive particle within its organic matrix to enhance its thermal conductivity. It may be desirable for conductive bumps 500 and the non-conductive fill layer to include the same organic matrix, but different suspended particles to simplify the curing process of step 410.

The non-conductive fill layer may desirably provide for addition thermal and mechanical coupling of electronic device 100 and flexible circuit board 102. This layer may also assist in forming a hermetic seal around electronic components, such as active material 110, coupled to the back surface of device substrate 104. Device substrate 104 and/or flexible substrate 118 may also form part of this hermetic seal.

Following either step 402 or step 404, the plurality of device electrical contacts 112 and the corresponding plurality of circuit board electrical contacts 116 are aligned with one another, step 406. FIGS. 5A–C show exemplary devices at this stage of manufacture according to the method of FIG. 4. The different embodiments are based on the locations in which conductive bumps 500 are formed in step 402.

Electronic device 100 and flexible circuit board 102 are then pressed together until each conductive bump contacts either the corresponding conductive bump (the exemplary embodiment of FIG. 5A) or electrical contact (the exemplary embodiments of FIGS. 5B and 5C), step 408. To ensure proper contact between the conductive bumps and the corresponding conductive bump or electrical contact, flexible circuit board 102 may be pressed using a surface, such as a rubber sheet over a hard surface, with sufficient elasticity to allow relatively even pressure over the surface even as flexible circuit board 102 flexes to desirably conform to the back surface of electronic device 100. Alternatively, an isostatic lamination method may be used to press electronic device 100 and flexible circuit board 102 together, using a flexible compressing membrane and a pressurized liquid, such as water. Isostatic lamination may be particularly useful exemplary embodiments in which the back surface of electronic device 100 is significantly non-planar, and/or significant deformation of the conductive bumps is desirable.

Figure 8:
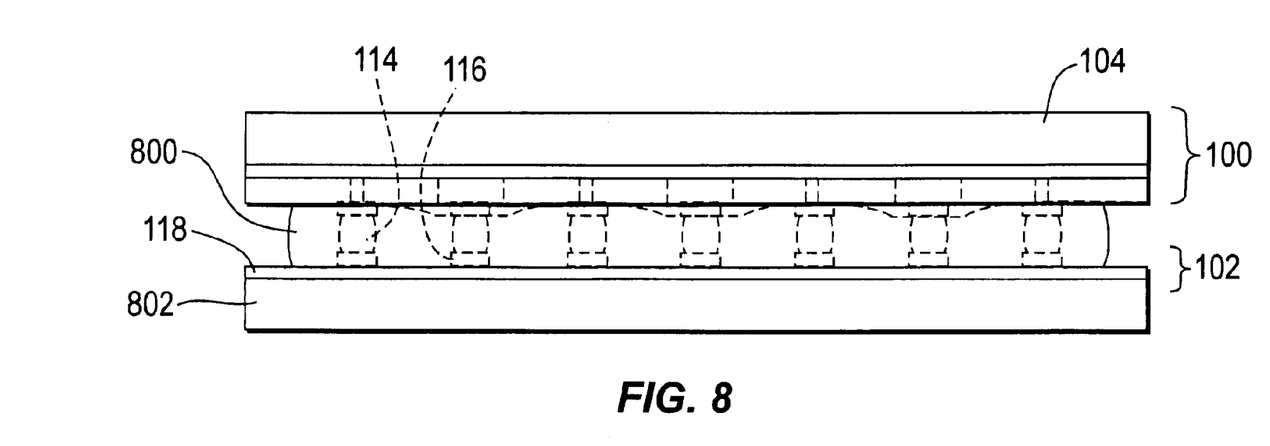
FIG. 8 is a side plan drawing of an additional exemplary electronic device and coupled flexible circuit board.

Conductive bumps 500 are then "cured" to form the Z-interconnections 114, step 410. The non-conductive fill layer may also be "cured" to form non-conductive fill 800, as shown in FIG. 8, at this step if alternative step 404 is used. The means of "curing" the conductive bumps (and possibly non-conductive fill layer) depends on the material from which they are formed, and may include, for example, heating or irradiating at least the conductive bumps.

It is contemplated that steps 406, 408, and 410 may be performed in stages with only a subset of the Z-interconnections being aligned, contacted, and cured at one time. This "piece meal" method may allow for improved yield of large area array devices, by allowing alignment corrections between sequential operations across the large surface area and numerous Z-interconnections.

For indium, or other cold welded Z-interconnections, the curing process involves applying sufficient pressure to electronic device 100 and flexible circuit board 102 to deform and cold weld conductive bumps 500 into Z-interconnections 114. This pressure may be applied uniformly or a pressor such as a roller may move across the back surface of the flexible substrate. This moving pressor method may be particular useful when large camber and/or non-uniformity of Z-interconnection size is expected, or a non-planar substrate is used.

Conductive bumps formed of conductive solder may be cured into Z-interconnections by using standard solder reflow techniques. It is noted that although a solder interconnection may be preferred to achieve high electrical conductivity, the desirable use of flux to facilitate solder wetting and the relatively high temperatures needed for solder reflow may be detrimental to the device. Therefore it may be desirable in some applications to combine a conductive solder bump on one electrical contact with a conductive organic material on the other electrical contact to form a hybrid Z-interconnection. These exemplary hybrid Z-interconnections are cured according to the type of conductive organic material used.

To cure conductive bumps formed of conductive epoxies or elastomers it is desirable to press electronic device 100 and flexible circuit board 102 together to desirably deform the conductive epoxy or elastomer bumps into the shape of the Z-interconnections. For radiation-curable conductive epoxy, the deformed bumps are then irradiated with the appropriate light, i.e. UV for UV-curable epoxies, to harden the epoxy. Thermally-curable conductive epoxy bumps are heated to their curing temperature and allowed to harden. Conductive elastomer Z-interconnections are held in place until the elastomer material has set.

Conductive thermoplastic bumps are cured by heating the bumps to above the softening temperature of the thermoplastic. Electronic device 100 and flexible circuit board 102 are then desirably pressed together to desirably deform the conductive thermoplastic bumps into the shape of the Z-interconnections. The Z-interconnections are then cooled to below the softening temperature to harden the Z-interconnection.

If a non-conductive fill layer was formed in alternative step 404, this layer may be cured using the same method as the corresponding conductive bump material. If identical organic matrices are used, the curing parameters may be almost identical, greatly simplifying the curing process.

With the possible exception of the embodiment using conductive solder Z-interconnections, which may require high reflow temperatures, this method does not introduce any stresses to the glass device panel during assembly. In addition, when the module is thermal cycled, thermal expansion mismatch between the glass front panel and the flex circuit does not lead to significant stresses because of the relatively low elastic modulus of the flex circuit.

It is noted that, flexible substrate 118 may have a thermal expansion coefficient which is significantly different from the thermal expansion coefficient of electronic device 100 and they may be at different temperatures, which may lead to large differences in thermal expansion. Differences in the thermal expansion of the electronic device and a rigid circuit board are largely absorbed by the elasticity of the Z-interconnections, but this may lead to failure of some of the Z-interconnections. The relatively much larger elasticity of flexible circuit board 102 compared to standard rigid circuit boards results in less strain on the Z-interconnections due to thermal expansion differences.

FIG. 8 illustrates two additional alternative features to reduce mechanical strain on the Z-interconnections due to thermal cycling. Non-conductive fill 800 may desirably improve thermal coupling between electronic device 100 and flexible circuit board 102, thereby decreasing their thermal gradients. Non-conductive fill 800 may be formed as described above in relation to the exemplary method of FIG. 4, or it may be formed by using a back fill technique after Z-interconnections 114 have been cured. It is noted that the Z-interconnections and non-conductive fill may alternatively be formed together using an anisotropic conductive adhesive disposed between electronic device 100 and flexible circuit board 102.

The second alternative exemplary feature shown in FIG. 8 is laminated substrate 802. Desirably, laminated substrate 802 has a thermal expansion coefficient approximately equal to the thermal expansion coefficient of device substrate 104. This substrate may desirably be laminated to flexible substrate 118 before or after the curing of Z-interconnections 114, depending on the interconnection tolerance and density desired. Laminated substrate 802 may reduce strain on Z-interconnections 114 and electronic device 100 by reducing differences in lateral thermal expansion between electronic device 100 and flexible circuit board 102. Also laminated substrate 802 may improve the lateral diffusion of heat in flexible substrate 118.

Figure 6:
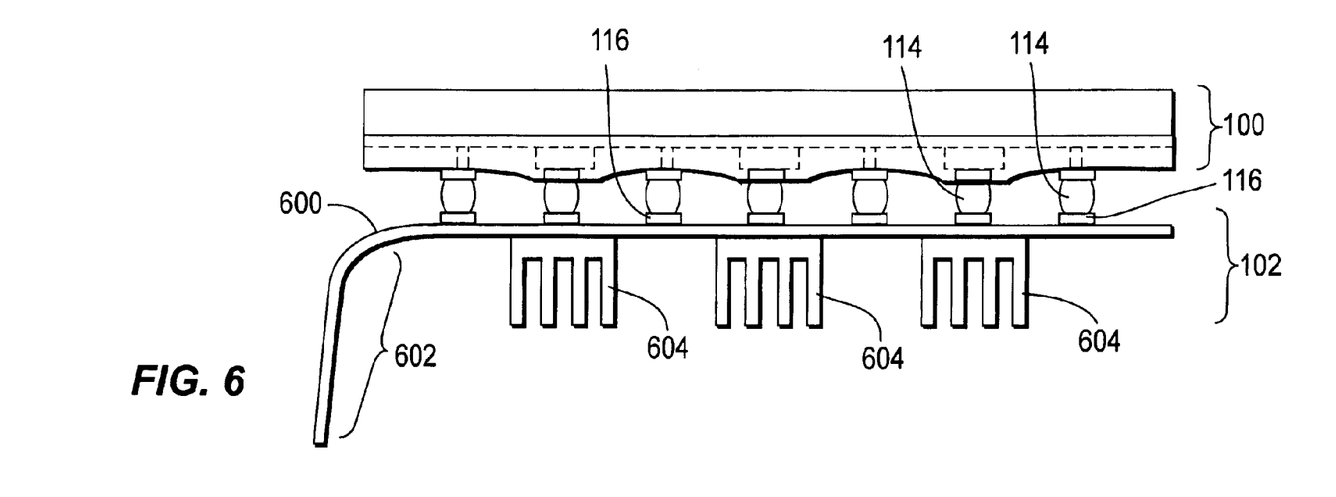
FIGS. 6, 7, 9, 10A and 10B are side cut-away drawing of alternative exemplary electronic devices and coupled flexible circuit boards, cut along line 1A—1A of FIG. 1B.

FIGS. 6, 7, 10A and 10B illustrate several alternative exemplary embodiments of flexible circuit board 102. In FIG. 6 exemplary flexible circuit board 102 includes extended flexible substrate 600 and heat sinks 604. Extended flexible substrate 600 may include a connector portion 602 that extends beyond the edge of electronic device 100. Electrical traces 122, 124, 126, and 128 may be extended along this portion of the flexible substrate to provide easily accessible connections to the flexible substrate from off of the device. This feature may be particularly useful for tiled optical display applications in which it is desirable for electronic device (display element array) 100 to butt directly up to an adjacent tile. Because of its flexibility, connector portion 60 of extended flexible substrate 600 may extend behind the adjacent tile and allow connection to off-device circuitry without interfering with the adjacent tiles.

Heat sinks 604 may be mounted on the back surface of the flexible substrate to assist with heat dissipation. Due to high heat transfer through the relatively thin, flexible substrate these heat sink may have a significant effect.

Figure 7:
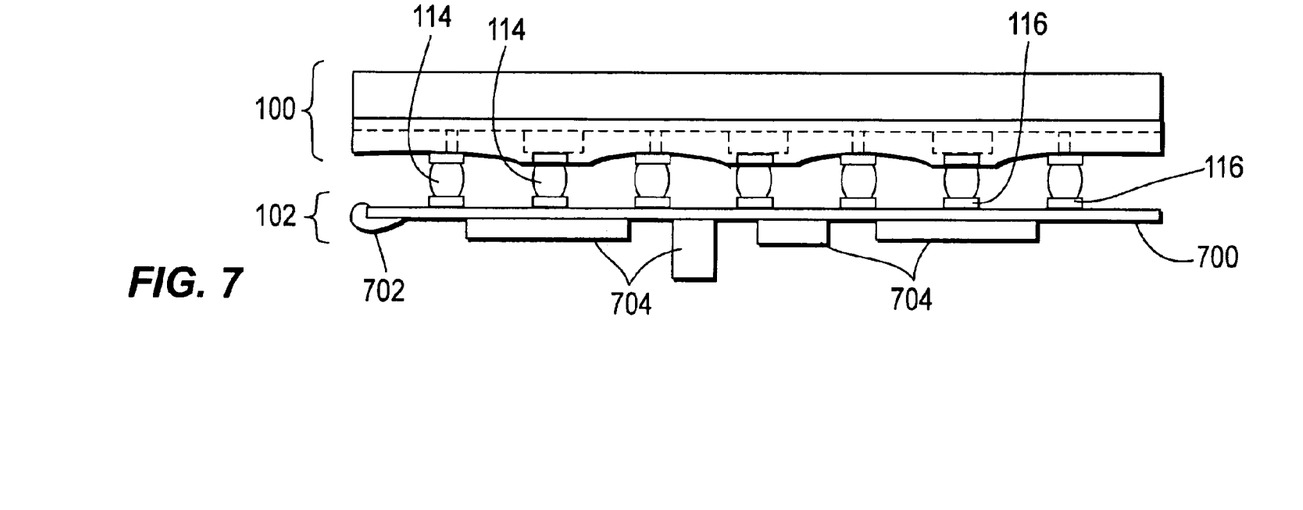

FIG. 7 illustrates two more alternative features that may be added to flexible circuit board 102, dual-sided flexible substrate 700 with electrical traces on both the front and back surfaces and back surface mounted electronics 704. A subset of front surface electrical traces 122, 124, 126, and 128 may be electrically coupled to a subset of the back surface electrical traces by wirebond 702 and or vias in the flexible substrate (not shown). Back surface mounted electronics 704 are desirably electrically coupled to the backside electrical traces. Exemplary back surface mounted electronics may include integrated circuits, memory circuitry, power supply circuitry to provide operational power for the electronic components of electronic device 100, control circuitry to control the electronic components, and analysis circuitry to analyze output signals from the electronic components.

Figure 9:
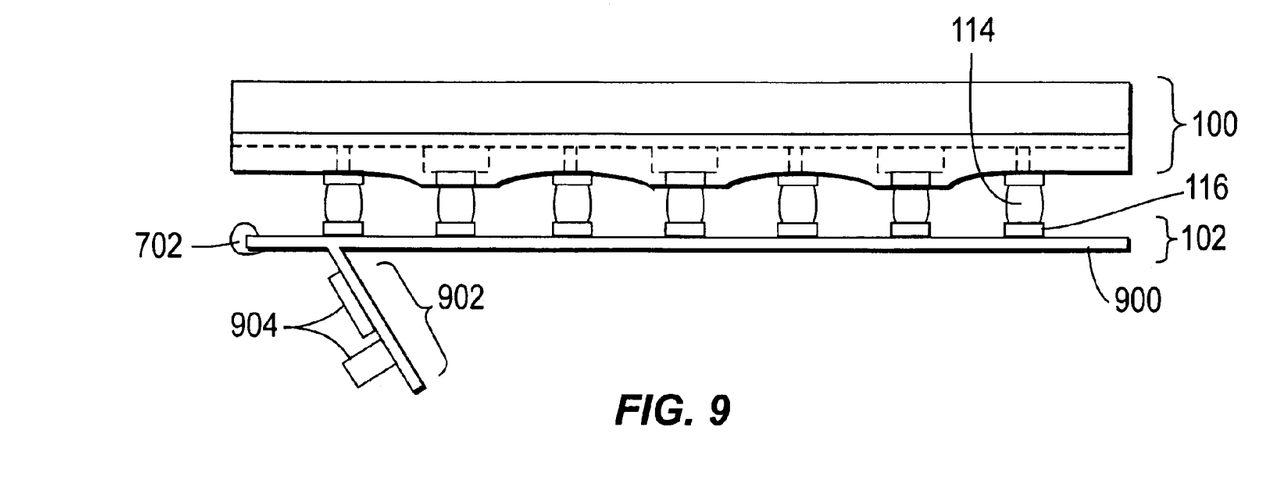
Figure 10A:
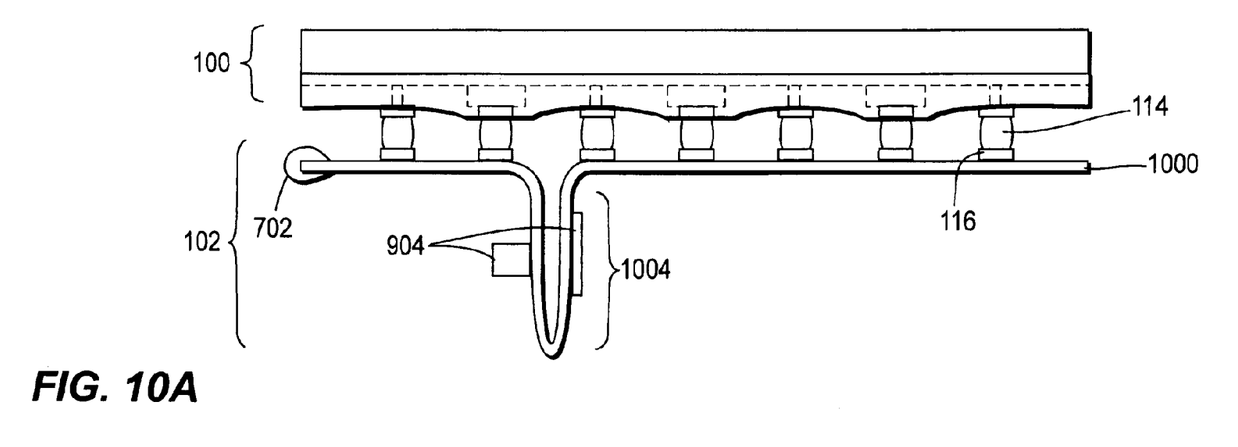
Figure 10B:
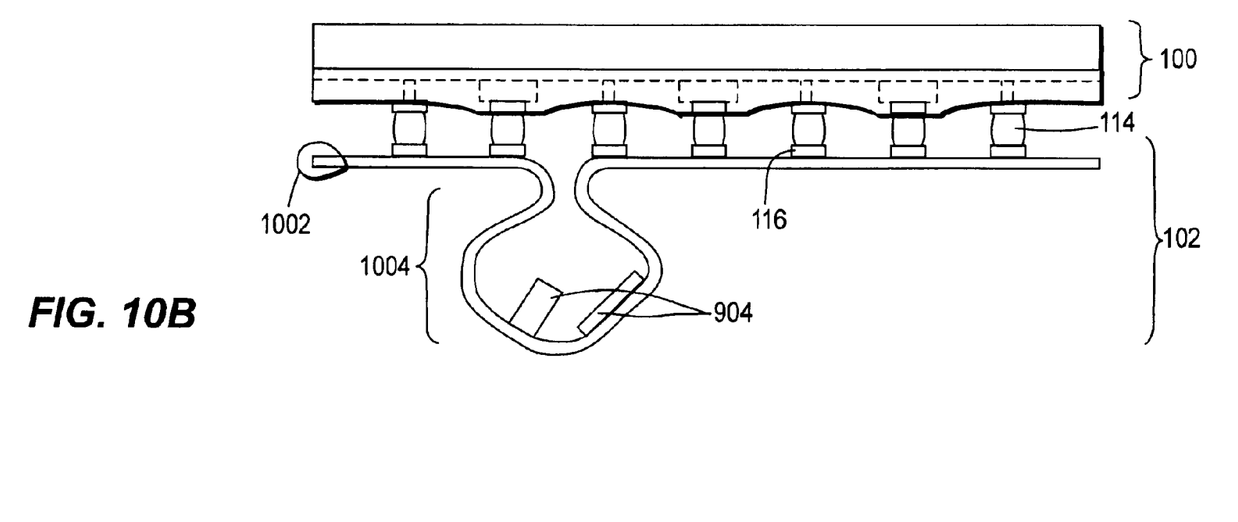

FIGS. 9, 10A and 10B include the additional feature of a flexible circuit board with an elevated portion which may be used to mount additional circuit board electronic components 904 similar to back surface mounted electronics 704 of FIG. 7. Exemplary flexible circuit board 102 of FIG. 9 includes Y-shaped flexible circuit board 900. Circuit board electronic components 904 may desirably be mounted to elevated portion 902 to provide a degree of thermal, and possibly electrical and electromagnetic, isolation from the rest of Y-shaped flexible circuit board 900. Thermal isolation may be improved by lengthening this elevated portion. Heat sinks may be added to elevated portion 902 to remove heat directly from electronic components 904.

Exemplary dual-sided folded flexible substrate 1000 in FIG. 10A and exemplary single-sided folded flexible substrate 1002 in FIG. 10B achieve this isolation by folding the flexible substrate away from electronic device 100 and then back between at least a pair of Z-interconnections to create folded elevated portion 1004. These folded flexible substrates may desirably be formed using the alternative "piece meal" method of manufacturing described above with reference to FIG. 4.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of manufacturing an electronic device, which includes a substrate having a back surface and a first thermal expansion coefficient, a plurality of electronic components coupled to the substrate, and a plurality of device electrical contacts coupled to the back surface of the substrate and electrically coupled to the plurality of electronic components, and a coupled flexible circuit board, which includes a flexible substrate having a front surface and a back surface, and a plurality of circuit board electrical contacts coupled to the front surface of the flexible substrate corresponding to plurality of device electrical contacts, comprising the steps of:
   a) providing the electronic device;
   b) providing the flexible circuit board;
   c) forming a plurality of conductive bumps on at least one of the electronic device and the flexible circuit board, for each device electrical contact, a conductive bump formed on at least one of that device electrical contact and a corresponding circuit board electrical contact;
   d) aligning the plurality of device electrical contacts of the electronic device and the corresponding plurality of circuit board electrical contacts;
   e) pressing the electronic device and the flexible circuit board together such that at least one of the plurality of conductive bumps spans the gap between each device electrical contact and the corresponding circuit board electrical contact; and
   f) curing the plurality of conductive bumps to form a plurality of Z-interconnections electrically and mechanically coupling the plurality of device electrical contacts to the corresponding plurality of circuit board electrical contacts.

2. The method of claim 1, wherein the plurality of conductive bumps are formed of at least one of indium, a conductive solder, a conductive thermally-curable epoxy, a conductive radiation-curable epoxy, a conductive thermoplastic, and a conductive elastomer.

3. The method of claim 1, wherein:
   the plurality of conductive bumps are indium bumps; and
   step (f) includes the step of pressing the electronic device and the flexible circuit board together to deform the indium bumps and cold weld the plurality of device electrical contacts to the corresponding plurality of circuit board electrical contacts.

4. The method of claim 1, wherein:
   the plurality of conductive bumps are conductive solder bumps; and
   step (f) includes the steps of:
      f1) heating the conductive solder bumps to at least a melting point temperature; and
      f2) forming the plurality of Z-interconnections by solder reflow.

5. The method of claim 1, wherein:
   the plurality of conductive bumps include a plurality of conductive thermally-curable epoxy bumps having a first curing temperature; and
   step (f) includes the steps of:
      f1) pressing the electronic device and the flexible circuit board together to deform the plurality of conductive thermally-curable epoxy bumps; and
      f2) heating the plurality of deformed conductive thermally-curable epoxy bumps to at least the first curing temperature.

6. The method of claim 5, wherein:
   step (c) further includes the step of forming a non-conductive thermally-curable epoxy fill layer on at least one of a portion of the back surface of the electronic device and a portion of the front surface of the flexible circuit board, the non-conductive thermally-curable epoxy fill layer having a second curing temperature approximately equal to the first curing temperature of the conductive thermally-curable epoxy bumps; and
   step (f2) further includes heating the non-conductive thermally-curable epoxy fill layer to at least the second curing temperature.

7. The method of claim 1, wherein:
the plurality of conductive bumps include a plurality of conductive radiation-curable epoxy bumps; and
step (f) includes the steps of:
  f1) pressing the electronic device and the flexible circuit board together to deform the plurality of conductive radiation-curable epoxy bumps; and
  f2) irradiating the plurality of deformed conductive radiation-curable epoxy bumps.

8. The method of claim 7, wherein:
step (c) further includes the step of forming a non-conductive radiation-curable epoxy fill layer on at least one of a portion of the back surface of the electronic device and a portion of the front surface of the flexible circuit board; and
step (f2) further includes irradiating the non-conductive radiation-curable epoxy fill layer.

9. The method of claim 1, wherein:
the plurality of conductive bumps include a plurality of conductive thermoplastic bumps having a first softening temperature; and
step (f) includes the steps of:
  f1) heating the plurality of conductive thermoplastic bumps to at least the first softening temperature;
  f2) pressing the electronic device and the flexible circuit board together to deform the plurality of conductive thermoplastic bumps; and
  f3) cooling the plurality of deformed conductive thermoplastic bumps to below the first softening temperature.

10. The method of claim 9, wherein:
step (c) further includes the step of forming a non-conductive thermoplastic fill layer on at least one of a portion of the back surface of the electronic device and a portion of the front surface of the flexible circuit board, the non-conductive thermoplastic fill layer having a second softening temperature approximately equal to the first softening temperature of the conductive thermoplastic bumps;
step (f1) further includes heating the non-conductive thermoplastic fill layer to at least the second softening temperature; and
step (f3) further includes cooling the non-conductive thermoplastic fill layer to below the second softening temperature.

11. The method of claim 1, wherein:
the plurality of conductive bumps include a plurality of conductive elastomer bumps; and
step (f) includes the steps of:
  f1) pressing the electronic device and the flexible circuit board together to deform the plurality of conductive elastomer bumps; and
  f2) holding the electronic device and the flexible circuit board together until the plurality of deformed conductive elastomer bumps are set.

12. The method of claim 11, wherein:
step (c) further includes the step of forming a non-conductive elastomer fill layer on at least one of a portion of the back surface of the electronic device and a portion of the front surface of the flexible circuit board; and
step (f2) further includes holding the electronic device and the flexible circuit board together until the non-conductive elastomer fill layer is set.

13. The method of claim 1, wherein at least one of the plurality of conductive bumps has a diameter of less than 5 mils.

14. The method of claim 1, further comprising the step of:
g) laminating a rigid substrate to at least a portion of the back surface of the flexible substrate of the flexible circuit board, the rigid substrate having a second thermal expansion coefficient approximately equal to the first thermal expansion coefficient of the substrate of the electronic device.

15. The method of claim 1, wherein:
the plurality of conductive bumps include a plurality of conductive solder bumps and a plurality of conductive organic bumps, for each device electrical contact;
  a conductive solder bump formed on one of that device electrical contact and a corresponding circuit board electrical contact; and
  a conductive organic bump formed on a remaining one of that device electrical contact and the corresponding circuit board electrical contact.

16. The method of claim 15, wherein:
the plurality of conductive organic bumps are a plurality of conductive thermally-curable epoxy bumps having a first curing temperature; and
step (f) includes the steps of:
  f1) pressing the electronic device and the flexible circuit board together to deform the plurality of conductive thermally-curable epoxy bumps against the plurality of conductive solder bumps; and
  f2) heating the plurality of deformed conductive thermally-curable epoxy bumps to at least the first curing temperature.

17. The method of claim 15, wherein:
the plurality of conductive organic bumps are a plurality of conductive radiation-curable epoxy bumps; and
step (f) includes the steps of:
  f1) pressing the electronic device and the flexible circuit board together to deform the plurality of conductive radiation-curable epoxy bumps against the plurality of conductive solder bumps; and
  f2) irradiating the plurality of deformed conductive radiation-curable epoxy bumps.

18. The method of claim 15, wherein:
the plurality of conductive organic bumps are a plurality of conductive thermoplastic bumps having a first softening temperature; and
step (f) includes the steps of:
  f1) heating the plurality of conductive thermoplastic bumps to at least the first softening temperature;
  f2) pressing the electronic device and the flexible circuit board together to deform the plurality of conductive thermoplastic bumps against the plurality of conductive solder bumps; and
  f3) cooling the plurality of deformed conductive thermoplastic bumps to below the first softening temperature.

19. The method of claim 15, wherein:
the plurality of conductive organic bumps are a plurality of conductive elastomer bumps; and
step (f) includes the steps of:
  f1) pressing the electronic device and the flexible circuit board together to deform the plurality of conductive elastomer bumps against the plurality of conductive solder bumps; and
  f2) holding the electronic device and the flexible circuit board together until the plurality of deformed conductive elastomer bumps are set.

* * * * *